(12) United States Patent
Shia et al.

(10) Patent No.: US 9,134,343 B2
(45) Date of Patent: Sep. 15, 2015

(54) SORT PROBE GRIPPER

(71) Applicants: David Shia, Portland, OR (US); Todd P. Albertson, Warren, OR (US)

(72) Inventors: David Shia, Portland, OR (US); Todd P. Albertson, Warren, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 13/630,141

(22) Filed: Sep. 28, 2012

(65) Prior Publication Data

US 2014/0091828 A1    Apr. 3, 2014

(51) Int. Cl.
| | |
|---|---|
| *G01R 31/00* | (2006.01) |
| *G01R 1/067* | (2006.01) |
| *G01R 3/00* | (2006.01) |
| G01R 1/073 | (2006.01) |

(52) U.S. Cl.
CPC .............. *G01R 1/06705* (2013.01); *G01R 3/00* (2013.01); *G01R 1/07307* (2013.01)

(58) Field of Classification Search
CPC .. G01R 1/06705; G01R 1/07307; G01R 3/00; G01R 31/043; G01R 31/3004; G01N 21/6489; G01N 21/66; G01N 21/9501
USPC ........... 324/759; 29/529.593, 705, 729; 901/2
See application file for complete search history.

(56) References Cited

U.S. PATENT DOCUMENTS

| | | | | |
|---|---|---|---|---|
| 2,918,646 | A * | 12/1959 | Davidson | ....................... 439/169 |
| 5,495,667 | A | 3/1996 | Farnworth | |
| 5,568,682 | A | 10/1996 | Gates et al. | |
| 5,590,455 | A | 1/1997 | Kato et al. | |
| 5,975,604 | A * | 11/1999 | Wolin et al. | .................... 294/198 |
| 7,877,876 | B2 | 2/2011 | Burke et al. | |
| 8,646,676 | B2 | 2/2014 | Nagao | |
| 8,701,276 | B2 | 4/2014 | Burke et al. | |
| 2003/0048108 | A1 | 3/2003 | Beaman et al. | |
| 2005/0062464 | A1* | 3/2005 | Foster et al. | ................ 324/158.1 |
| 2006/0021669 | A1* | 2/2006 | Stark | .............................. 140/147 |
| 2010/0043224 | A1 | 2/2010 | Burke et al. | |
| 2012/0139365 | A1* | 6/2012 | Pelrine et al. | ............... 310/12.05 |
| 2013/0269173 | A1* | 10/2013 | Albertson et al. | ............... 29/593 |

FOREIGN PATENT DOCUMENTS

WO     WO9616440     5/1996

OTHER PUBLICATIONS

PCT Search Report and Written Opinion, PCT/US2011/068229, Oct. 4, 2012, 11 pages.
US Office Action for U.S. Appl. No. 13/995,931, Apr. 20. 2015, 5 pages.

* cited by examiner

*Primary Examiner* — Melissa Koval
*Assistant Examiner* — Felicia Farrow
(74) *Attorney, Agent, or Firm* — Blakely, Sokoloff, Taylor & Zafman LLP

(57) ABSTRACT

An apparatus includes a robot and a sort probe gripper. The sort probe gripper includes a body, a jaw mount inserted into the body, a plurality of grippers mounted in the jaw mount and an actuator sleeve slidable along the body to engage the plurality of grippers.

18 Claims, 5 Drawing Sheets

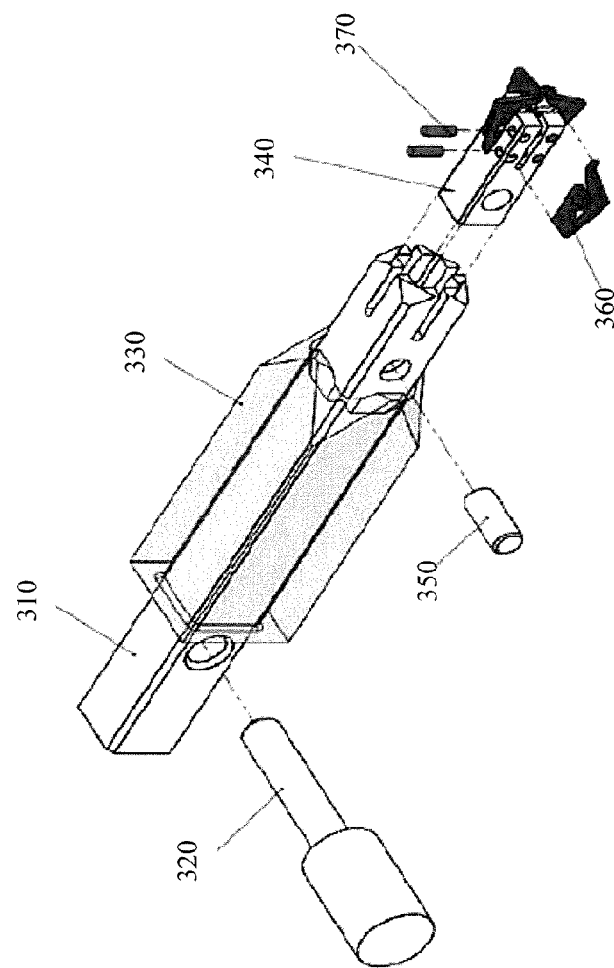
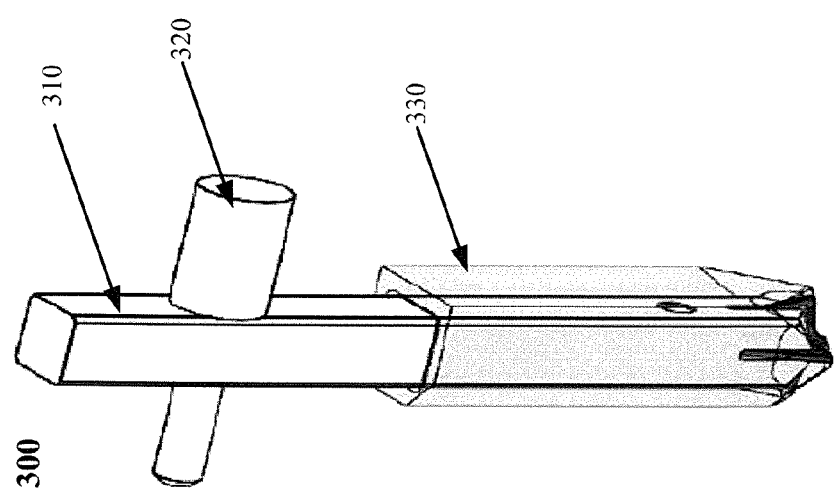

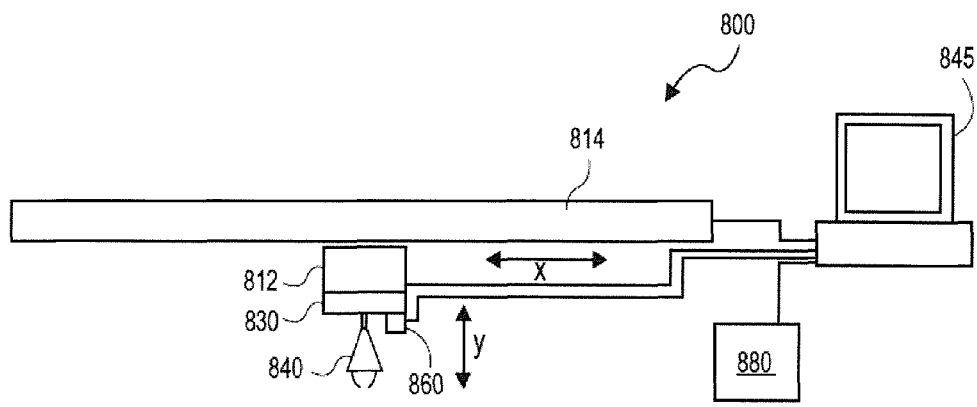
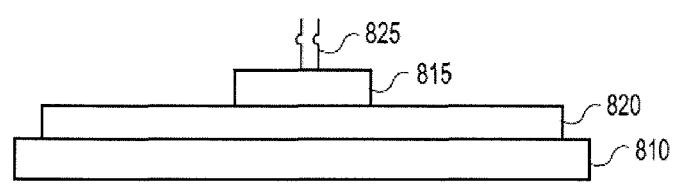
Figure 8
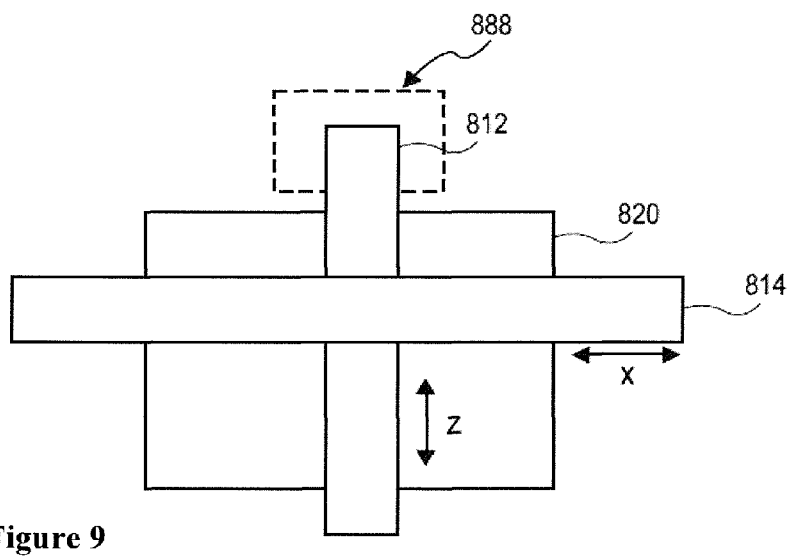
Figure 9

SORT PROBE GRIPPER

FIELD OF THE INVENTION

The present disclosure generally relates to sort probe assembly and repair.

BACKGROUND

In the manufacture of semiconductor devices, it is necessary that such devices be tested at the wafer level to evaluate their functionality. The process in which die in a wafer are tested is commonly referred to as "wafer sort." Testing and determining design flaws at the die level offers several advantages. First, it allows designers to evaluate the functionality of new devices during development. Increasing packaging costs also make wafer sorting a viable cost saver, in that reliability of each die on a wafer may be tested before incurring the higher costs of packaging. Measuring reliability also allows the performance of the production process to be evaluated and production consistency rated, such as for example by "bin switching" whereby the performance of a wafer is downgraded because that wafer's performance did not meet the expected criteria.

Generally, two tests are conducted on devices at the wafer level. The first test is conducted to determine if the individual devices on the wafer are functional. A second test is conducted to determine a performance parameter for the good devices on the wafer. For example, currently wafers have hundreds to thousands of microprocessors. Each of these microprocessors is tested to determine if the microprocessor is good. The speed of the microprocessor is determined in a second test. Once measured, the speed of the microprocessor is saved and the location of the microprocessor on the wafer is noted. This information is used to sort the microprocessors based on performance at the time the wafer is sliced and diced to form individual dies, each of which has a microprocessor thereon.

Each device formed on a wafer has a number of electrical contacts. For example, testing an individual microprocessor commonly requires hundreds to thousands of different individual contacts to be made to the microprocessor on the wafer. Testing each contact requires more than merely touching each electrical contact. An amount of force must be applied to a contact to break through any oxide layer that may have been formed on the surface of the contact. Forming 3000 contacts, which are not all at the same height and not all in the same plane, is also difficult. As a result, a force has to be applied to the contacts to assure good electrical contact and to compensate for the lack of planarity among the contacts.

A membrane probe card is currently used to conduct high frequency sort and test procedures. The membrane probe card includes a rigid substrate and a large number of electrical probes. Probe card substrates have for example 500 to 7,000 probes or more depending, for example, on the microprocessor testing requirements. The probes include an attached end and a free end to contact individual electrical contacts on a device. Repair of a probe card substrate, such as when a probe is deformed (e.g., recessed) is generally work that has to be done by hand. For example, sort probe repair is currently carried out an operator physically accessing a damaged probe via a pair of tweezers, and mechanically manipulating the probe to place it at a desired location. Often, the operator will pull the probe a significant distance past the spacing between the probes during the repair process, causing the probe to bump and deform neighboring probes. As a result, otherwise fine probes are damaged and/or pushed out of original positions.

BRIEF DESCRIPTION OF THE DRAWINGS

FIGS. 3A & 3B illustrate embodiments of a gripper.
FIG. 8 illustrates a schematic side view representation of another embodiment system suitable to repair or assemble a probe card substrate;
FIG. 9 shows a top view of a portion of the system of FIG. 8.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Figure 1:
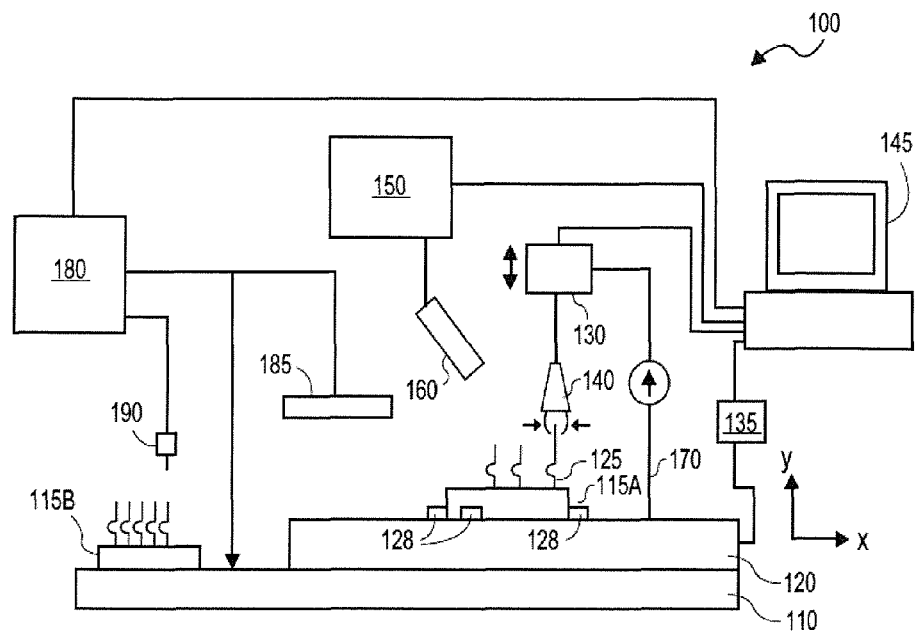
FIG. 1 illustrates shows a schematic side view representation of an embodiment of a system suitable to repair or assemble a probe card substrate.
Figure 2:
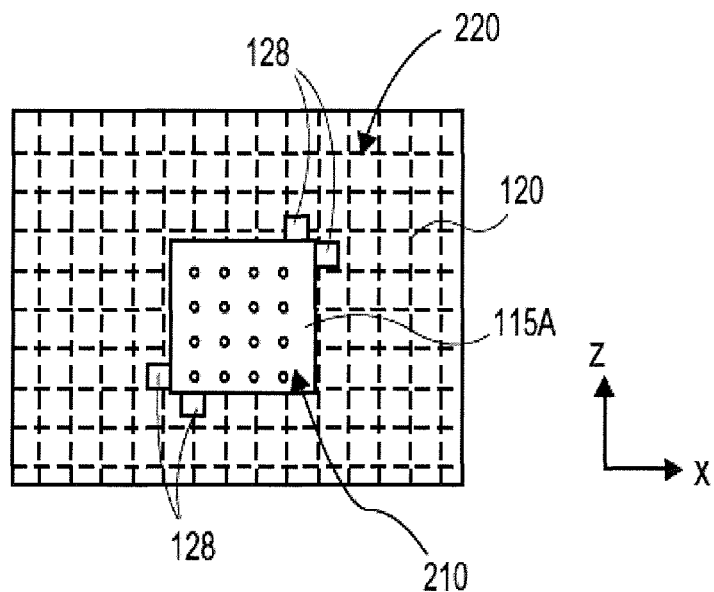
FIG. 2 illustrates a top view of a portion of the system.

FIG. 1 shows one embodiment of a system 100 that may be used for the automated repair of a probe card substrate such as a space transformer of a probe card and/or an assembly of a probe card substrate. System 100 includes platform 110 onto which substrate 120 is mounted. Substrate 120, in one embodiment, has a surface area that can accommodate a probe head or a full probe card. In this embodiment, substrate 120 is a substrate that is translatable in an x and a z direction. Representatively, substrate 120 is translatable in x and y directions according to a grid system configurable for the pitch of a probe card substrate. A representative pitch is on the order of 40 microns (μm) to 130 μm. It is appreciated that other pitches may be utilized. FIG. 2 shows a top view of substrate 120 and illustrates the xz-pitch 220 in a grid of dashed lines. Control of the translation of substrate 120 is provided by machine-readable instructions in processor 145 to which substrate 120 is connected through motor 135. In one embodiment, placement of a probe card substrate, such as probe card substrate 115A, which includes probes 125, on substrate 120 is controlled so that its location and x and a z coordinates are known by processor 145. One way the placement of a probe card substrate 115A on substrate 120 is known is by alignment blocks 128 on substrate 120.

Referring again to FIG. 1, also connected to processor 145 is robot 130. The term robot is to be interpreted broadly as a conveyance, transfer device, electro-mechanical transfer device or mechanism, or automatically controlled, reprogrammable, multipurpose manipulator programmable in three, four, or more axes. Robot 130 may take various forms or configurations, consistent with its intended purpose. For example, in various embodiments, robot 130 may be a Gantry or Cartesian coordinate type robot, a selective compliant assembly robot arm (SCARA) type robot, an articulated arm type robot, or a combination thereof (e.g., a SCARA type robot coupled in a Gantry type robot configuration).

In one or more embodiments, robot 130 may have a robotic arm or other mechanical limb. The arm or limb may include an interconnected set of two or more links and one or more powered joints. In one or more embodiments, the arm or limb may allow rotation or movement in at least four axes. As is known, the flexibility or freedom of movement of the arm increases with increasing number of axes. The arm or limb may support and move an end-of-arm tooling or other end effector that is connected at the end of the arm or limb.

The end effector may allow the robot to perform certain intended functions, such as, for example, engaging with an item (e.g., a probe), holding and moving the item, and disengaging from the item. In one or more embodiments, the end effector may include gripper 140. Gripper 140 may serve as a "hand" to grasp, clasp, or otherwise engage with, hold and move, and disengage from an item.

FIGS. 3A & 3B illustrate embodiments of a gripper 300 implemented as the gripper 140 in FIG. 1. FIG. 3A illustrates a side view of one embodiment of gripper 300, which includes gripper body 310, retainer pin 320 and actuator sleeve 330. In one embodiment, actuator sleeve 330 has the ability to slide along gripper body 310. Retainer pin 320 is implemented to attach gripper body 310 to robot 130.

Figure 4:
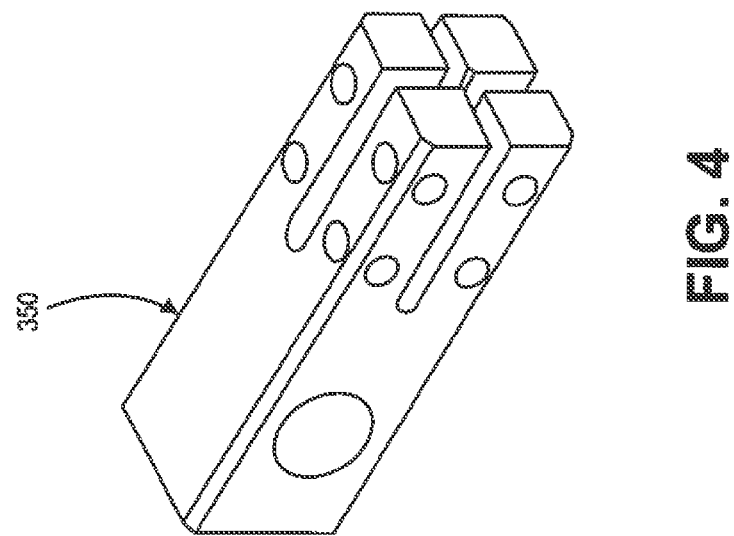
FIG. 4 illustrates one embodiment of a jaw mount.

FIG. 3B illustrates an exploded view of one embodiment of gripper 300. As shown in FIG. 3B, gripper 300 includes a jaw mount 340 that is inserted in a bottom end of gripper body 310 and an insert pin 350 to attach jaw mount 340 to gripper body 310. FIG. 4 illustrates one embodiment of a jaw mount 340.

Figure 5:
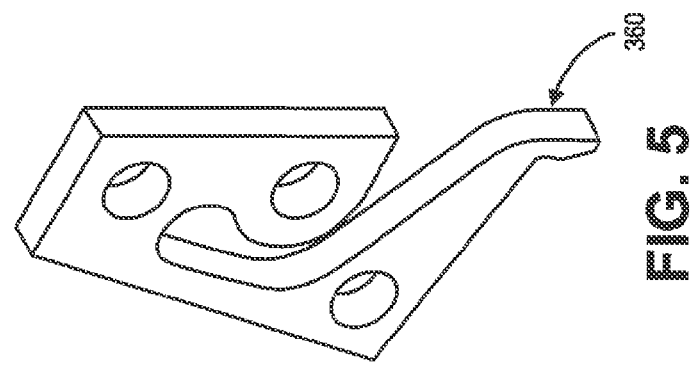
FIG. 5 illustrates one embodiment of a gripper jaw.

Referring back to FIG. 3B, gripper 300 also includes gripper jaws 360 inserted into jaw mount. FIG. 5 illustrates one embodiment of a gripper jaw 360. According to one embodiment, four gripper jaws 360 are attached to a bottom end of jaw mount 340 in order to grip a sort probe. Gripper jaws 360 are activated by upon mechanical pressure being provided by actuator sleeve 330 upon actuator sleeve 330 sliding to the bottom end of gripper body 310.

Figure 6:
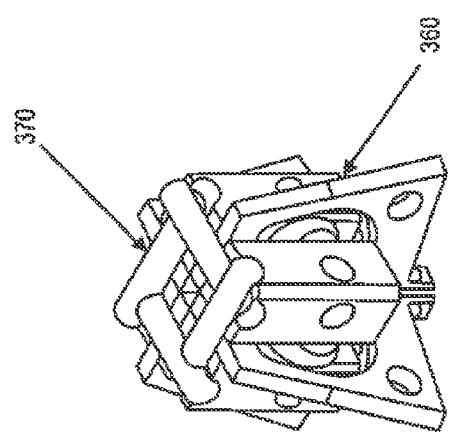
FIG. 6 illustrates one embodiment of a pinion shaft installation.

Referring back to FIG. 3B, pinion shafts 370 are included to attach gripper jaws 360 to jaw mount 340. According to one embodiment, two pinions shafts 370 are implemented to attach each gripper jaws 360 to jaw mount 340, resulting in a total of eight pinion shafts. FIG. 6 illustrates one embodiment of a pinion shaft 370 attachment of gripper jaws 360 to jaw mount 340.

Figure 7:
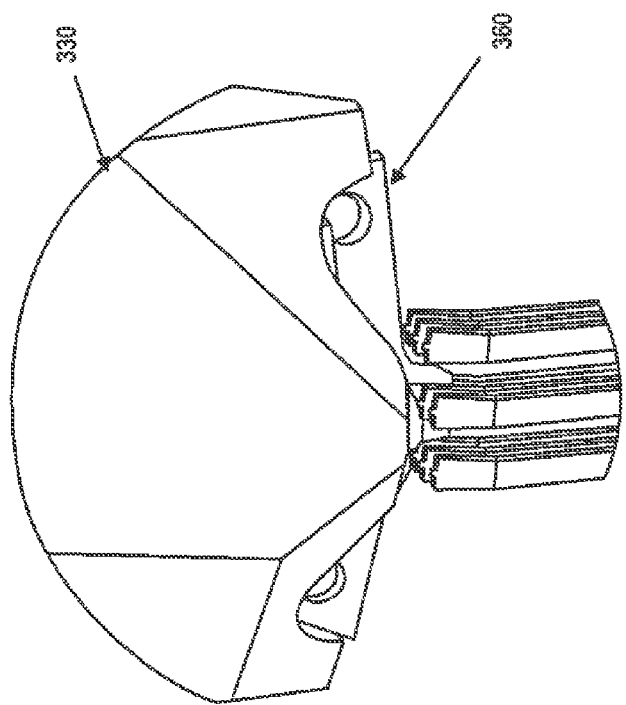
FIG. 7 illustrates another embodiment of a gripper.

During a probe gripping operation, actuator sleeve 330 slides down over gripper jaws 360. Upon coming in contact with actuator sleeve 330, gripper jaws 360 are closed, enabling gripping of a sort probe. FIG. 7 illustrates an embodiment of gripper 300 with actuator sleeve 330 engaged with gripper jaws 360. Once actuator sleeve 330 slides up, gripper jaws 360 are disengaged, and thus open to release the sort probe.

Gripper 300 is capable of generating up to one Newton of gripping force, enabling the manipulation of probes without losing hold. In a further embodiment, gripper enables current to be passed to a probe during repair, which heats up the probe in order to limit an amount of deformation required to manipulate the probe into position.

Referring back to FIG. 1, system 100 includes a heat source to heat a probe, for example, while gripper 140 grasps a probe 125 on substrate 115A. As discussed above, heating of a probe may be desired to repair a configuration of a probe that is connected to a probe card substrate or to affix a probe to a probe card substrate. FIG. 1 shows heat source 170 that is representatively a resistive heat source.

System 100 of FIG. 1 also includes vision module 150. Vision module 150 includes imaging submodule 160 that has a field of view including probe card substrate 115A, one or more probes on substrate 115A and a portion of gripper 140 including the entire portion. Vision module 150 also includes a reproduction submodule connected to the imaging submodule to reproduce the field of view of the submodule on a screen, such as screen associated with processor 145. Vision module 150 permits optical metrology testing of probes and allows an operator to view the repair or assembling of the probe card substrate, such as probe card substrate 115A, and may also be used to identify a location on a probe card substrate for assembly or repair using positioning instructions.

In the embodiment illustrated in FIG. 1, system 100 also includes testing module 180. Testing module 180 is connected to processor 145 and, in one embodiment, is in a second area of platform 110 away from substrate 120.

FIG. 1 shows probe card substrate 115B that is, for example, an assembled or repaired probe card substrate on platform 110 that may be undergoing testing by testing module 180. Testing module 180 is configured to test a probe that is connected to a probe card substrate or a series of probes connected to the probe card substrate. In one embodiment, testing module 180 includes conductor plate 185 for planarity measurements. Representatively, testing module 180 also includes submodule 190 that may be used, representatively, to test the continuity of individual probes and for spring constant measuring.

FIG. 8 shows another embodiment of a system. System 800 includes platform 810 onto which substrate 820 is mounted. Substrate 820, in one embodiment, is stationary and in another embodiment, is translatable in an x- and a z-direction similar to substrate 120 in FIG. 1 by instructions provided by processor 845.

Referring again to FIG. 8, also connected to processor 845 is robot 830. As described above, robot 830 may take various forms or configurations, consistent with its intended purpose. Connected to robot 830 is an end effector such as gripper 840. Robot 830 is configured to move in a work envelope. That work envelope includes movement in a y-direction (e.g., up or down as viewed). In this embodiment, robot is connected to first track 812 that extends in a z-direction at least the length of substrate 820. The z-position of track 812 is fixed to define a z-direction work envelope of robot 830. Track 812 is translatably connected to track 814 by, for example rails. Track 814 extends in an x-direction with the x-position of track 814 fixed to define an x-direction work envelope of robot 830. FIG. 9 shows a top view of substrate 820 and illustrates track 812 and track 814. Control of the translation of track 812 and robot 830 is provided by machine-readable instructions in processor 845 to which track 812 and robot 830 are connected through a motor. FIG. 9 also shows track 812 extends to area 888 that is, for example, an area where stored probes may be located.

Other features of system 800 are similar to that of system 100 in FIG. 1. Those features include vision module 860 connected to robot 830 and testing module 880.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A sort probe gripper comprising:
a body;
a jaw mount inserted into the body;
a plurality of grippers mounted in the jaw mount; and
an actuator sleeve slidable along the body to engage the plurality of grippers, wherein the grippers are closed upon a mechanical pressure being applied by the actuator sleeve sliding to a bottom end of the body and opened upon the mechanical pressure being removed by the actuator sleeve sliding up the body.

2. The sort probe gripper of claim 1 further comprising an insert pin to attach the jaw mount to the body.

3. The sort probe gripper of claim 2 further comprising one or more pinion shafts to attach each gripper to the jaw mount.

4. The sort probe gripper of claim 3 wherein two pinion shafts attach each gripper to the jaw mount.

5. The sort probe gripper of claim 3 further comprising a retainer pin.

6. The sort probe gripper of claim 5 wherein the sort probe gripper receives a current to heat a sort probe.

7. An apparatus comprising:
a probe card substrate including one or more sort probes; and
a sort probe gripper including:
a body;
a jaw mount inserted into the body;
a plurality of grippers mounted in the jaw mount to grasp a sort probe; and
an actuator sleeve slidable along the body to engage the plurality of grippers, wherein the grippers are closed upon a mechanical pressure being applied by the actuator sleeve sliding to a bottom end of the body and opened upon the mechanical pressure being removed by the actuator sleeve sliding up the body.

8. The apparatus of claim 7 wherein the sort probe gripper further comprises an insert pin to attach the jaw mount to the body.

9. The apparatus of claim 8 wherein the sort probe gripper further comprises one or more pinion shafts to attach each gripper to the jaw mount.

10. The apparatus of claim 9 wherein two pinion shafts attach each gripper to the jaw mount.

11. The apparatus of claim 9 wherein the sort probe gripper further comprises a retainer pin.

12. The apparatus of claim 11 wherein the sort probe gripper receives a current to heat the sort probe.

13. An apparatus comprising:
a robot; and
a sort probe gripper coupled to the robot to grasp a probe, including:
a body;
a jaw mount inserted into the body;
a plurality of grippers mounted in the jaw mount to grasp the sort probe; and
an actuator sleeve slidable along the body to engage the plurality of grippers, wherein the grippers are closed upon a mechanical pressure being applied by the actuator sleeve sliding to a bottom end of the body and opened upon the mechanical pressure being removed by the actuator sleeve sliding up the body.

14. The apparatus of claim 13 wherein the sort probe gripper further comprises an insert pin to attach the jaw mount to the body.

15. The apparatus of claim 14 wherein the sort probe gripper further comprises one or more pinion shafts to attach each gripper to the jaw mount.

16. The apparatus of claim 15 wherein two pinion shafts attach each gripper to the jaw mount.

17. The apparatus of claim 15 wherein the sort probe gripper further comprises a retainer pin.

18. The apparatus of claim 17 wherein the sort probe gripper receives a current to heat the sort probe.

* * * * *